(12) United States Patent
Lee et al.

(10) Patent No.: US 12,130,095 B2
(45) Date of Patent: Oct. 29, 2024

(54) THERMAL INTERFACE MATERIALS

(71) Applicant: Henkel AG & Co. KGaA, Duesseldorf (DE)

(72) Inventors: Yong Joon Lee, Burlington, MA (US); William J. Scimeca, Boston, MA (US); Nicolo Brambilla, Brookline, MA (US); Daniel Rich, Cambridge, MA (US)

(73) Assignee: Henkel AG & Co. KGaA, Duesseldorf (DE)

( * ) Notice: Subject to any disclaimer, the term of this patent is extended or adjusted under 35 U.S.C. 154(b) by 268 days.

(21) Appl. No.: 17/316,055

(22) Filed: May 10, 2021

(65) Prior Publication Data

US 2021/0265234 A1    Aug. 26, 2021

Related U.S. Application Data

(63) Continuation of application No. 17/165,363, filed on Feb. 2, 2021, now Pat. No. 11,326,843, which is a continuation of application No. PCT/US2020/044286, filed on Jul. 30, 2020.

(60) Provisional application No. 62/880,370, filed on Jul. 30, 2019.

(51) Int. Cl.
| | | |
|---|---|---|
| F28F 21/06 | (2006.01) | |
| B29C 43/00 | (2006.01) | |
| B29C 43/20 | (2006.01) | |
| B29C 43/32 | (2006.01) | |
| B29C 69/00 | (2006.01) | |
| B29K 101/12 | (2006.01) | |
| B29K 507/04 | (2006.01) | |
| B29L 31/18 | (2006.01) | |
| B32B 25/08 | (2006.01) | |
| B32B 27/20 | (2006.01) | |
| H01L 23/367 | (2006.01) | |
| H01L 23/373 | (2006.01) | |
| H05K 7/20 | (2006.01) | |

(52) U.S. Cl.
CPC .......... *F28F 21/065* (2013.01); *B29C 43/003* (2013.01); *B29C 43/203* (2013.01); *B29C 43/32* (2013.01); *B29C 69/001* (2013.01); *B32B 25/08* (2013.01); *B32B 27/20* (2013.01); *H01L 23/3675* (2013.01); *H01L 23/3733* (2013.01); *H05K 7/20481* (2013.01); *B29K 2101/12* (2013.01); *B29K 2507/04* (2013.01); *B29K 2995/0013* (2013.01); *B29L 2031/18* (2013.01); *B32B 2307/302* (2013.01)

(58) Field of Classification Search
None
See application file for complete search history.

(56) References Cited

U.S. PATENT DOCUMENTS

| | | |
|---|---|---|
| 2006/0258054 A1 | 11/2006 | Pan et al. |
| 2009/0269604 A1 | 10/2009 | Wang et al. |
| 2010/0073882 A1 | 3/2010 | Yoshikawa et al. |
| 2010/0200801 A1 | 8/2010 | Ramasamy et al. |
| 2014/0345843 A1 | 11/2014 | Kirkor et al. |
| 2014/0374648 A1 | 12/2014 | Tanaka et al. |
| 2015/0030835 A1 | 1/2015 | Tanaka et al. |
| 2018/0163112 A1 | 6/2018 | Watanabe et al. |
| 2018/0194122 A1 | 7/2018 | Kumamoto et al. |

FOREIGN PATENT DOCUMENTS

| | | |
|---|---|---|
| JP | 2002026202 A | 1/2002 |
| JP | 2010132866 A | 6/2010 |
| JP | 2013070015 A | 4/2013 |
| JP | 2014001388 A | 1/2014 |
| JP | 2019021687 A | 2/2019 |
| WO | 2016129257 A1 | 8/2016 |

OTHER PUBLICATIONS

International Search Report and Written Opinion for International Application No. PCT/US2020/044286 International Filing date Jul. 30, 2020; Report Mail Date Oct. 29, 2020; 9 pages.

*Primary Examiner* — Cheng Yuan Huang
(74) *Attorney, Agent, or Firm* — Steven C. Bauman

(57) ABSTRACT

Disclosed herein is a thermal interface material comprising a sheet extending between a first major surface and a second major surface, the sheet comprising a base material; and a filler material embedded in the base material comprising anisotropically oriented thermally conductive elements; wherein the thermally conductive elements are preferentially oriented along a primary direction from the first major surface towards the second major surface to promote thermal conduction though the sheet along the primary direction; and wherein the base material is substantially free of silicone.

14 Claims, 12 Drawing Sheets

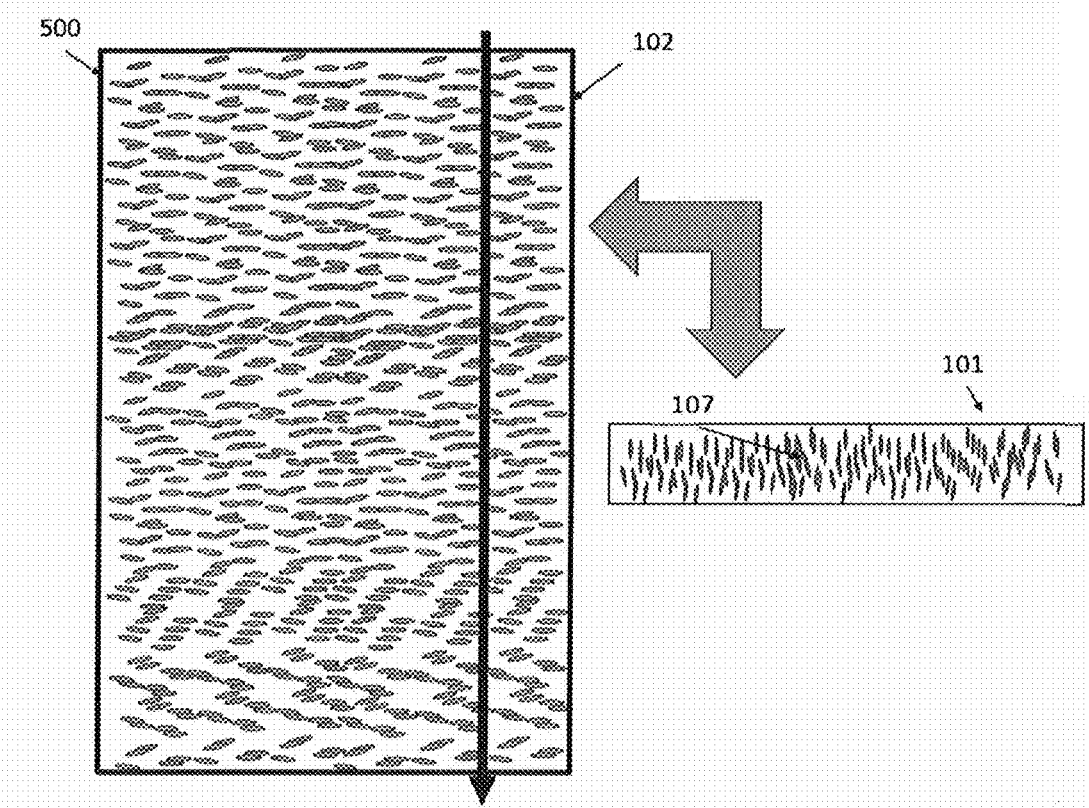

THERMAL INTERFACE MATERIALS

CROSS REFERENCE TO RELATED APPLICATIONS

The present application is a continuation of U.S. application Ser. No. 17/165,363, filed Feb. 2, 2021, which is a continuation of PCT Application No. PCT/US2020/044286, filed Jul. 30, 2020, which claims the benefit of and priority to U.S. Provisional Application No. 62/880,370, filed Jul. 30, 2019, the contents of each of which are incorporated herein in their entirety.

BACKGROUND OF THE INVENTION

1. Field of the Invention

The invention disclosed herein relates to thermal interface materials and, in particular, to composite materials for providing efficient transfer of heat away from electronic components.

2. Description of the Related Art

As electronics continue to shrink in size while increasing in capabilities, a very real and limiting concern is that of heat generation. That is, the performance of high-density circuits may suffer substantially without effective heat dissipation. One important set of tools in heat dissipation includes a variety of thermal interface materials.

The term "thermal interface material" (also referred to herein as "TIM") generally describes any material that is inserted between two parts in order to enhance the thermal coupling between the two components. Many designs involve use of thermal interface material inserted between a heat producing device (e.g., the heat source, such as a processor) and a heat dissipation device (e.g., the heat sink).

There are several kinds of thermal interface materials commonly used. These include thermal grease, thermal adhesive, thermally conductive pads, thermal tape, and phase change materials.

Thermal grease results in a thin bond line and therefore a small thermal resistance. Thermal grease has no effective mechanical strength and therefore requires an external mechanical fixation mechanism. Because thermal grease does not cure, use is limited to where the material can be contained or in thin applications where the viscosity of the grease will allow it to stay in position during use.

Thermal adhesive or thermal glue provides some mechanical strength to the bond after curing. Thermal glue allows a thicker bond line than the thermal grease as it cures.

Thermally conductive pads are generally mostly made of silicone or silicone-like material. Thermally conductive pads have the advantage of being easy to apply and allowing thicker bond lines. Typically, thermally conductive pads require higher force to press the heat sink on the heat source so that the thermal pad will conform to the surface of a particular device. This can be problematic or prohibitive for sensitive devices where any deformation will result in signal interference.

Thermal tape may be used. Generally, thermal tape adheres to a surface, requires no curing time and is easy to apply. Thermal tape is similar to a thermal pad with adhesive properties.

Phase-change materials (PCM) may be used. Generally, phase-change materials are naturally sticky materials and may be used as replacement of thermal greases. Application is similar to solid pads. After reaching a melting point, typically about 55-60 degrees Celsius, the phase-change materials will change to an at least partially liquid state and fill all gaps between heat source and heat sink.

These and other embodiments of thermal interface materials make use of a variety of compositions. Some embodiments of compositions include dispersions of dimensional materials. For example, some compositions may include thermally conductive fibers. In some embodiments, carbon nanotubes may be included. While such embodiments may have shown some promise, demand for performance requires further improvement.

That is, unfortunately, advances in circuit design have outpaced improvements to heat dissipation technologies. While the foregoing types of thermal interface materials have served present day electronics, advances in system designs are increasingly constrained by heat generation.

What are needed are improved technologies for heat dissipation in electronic systems.

SUMMARY OF THE INVENTION

In one aspect, a thermal interface material is disclosed including a sheet extending between a first major surface and a second major surface, the sheet including a base material and a filler material embedded in the base material. The filler material includes anisotropically oriented thermally conductive elements. In some embodiments, the thermally conductive elements are preferentially oriented along a primary direction from the first major surface towards the second major surface to selectively promote thermal conduction though the sheet along the primary direction. In some embodiments, the base material is substantially free of silicone. In some embodiments, the thermal conductivity of the sheet along the primary direction is at least 15 W/mK, 20 W/mK, 30 W/mK, 40 W/mK, 50 W/mK, 60 W/mK, 70 W/mK, 80 W/mK, 90 W/mK, 100 W/mK, or more.

In another aspect, a method of making a thermal interface material is disclosed, the method including following steps. In a step, forming a stack comprising a plurality of layers. In some embodiments, each layer comprises a base material, and a filler material comprising anisotropically oriented thermally conductive elements. In some embodiments, each layer extends from a bottom surface to a top surface along a vertical direction, and the layers are stacked in said vertical direction. In some embodiments, the thermally conductive elements in each layer are anisotropically oriented to preferentially promote thermal flow in directions transverse to the vertical direction.

In a further step, applying force to the stack to compress the stack along the vertical direction. In some embodiments, this compression causes the layers of the stack to join and form a monolithic element.

In a further step slicing the stack along a plane extending in the vertical direction and transverse to the top and bottom surfaces of the layers to form a sheet. In some embodiments, the sheet extends between a first major surface and a second major surface and includes a portion of the base material and the filler material cut from the stack. The filler material includes anisotropically oriented thermally conductive elements that are preferentially oriented along a primary direction from the first major surface towards the second major surface to promote thermal conduction though the sheet along the primary direction.

Various embodiments may include any of the features and elements described herein, either alone or in any suitable combination.

BRIEF DESCRIPTION OF THE DRAWINGS

The features and advantages of the invention are apparent from the following description taken in conjunction with the accompanying drawings in which:

FIG. 6B is an illustration of the final steps in a method of fabrication of a thermal interface pad of the type shown in FIG. 2;

DETAILED DESCRIPTION OF THE INVENTION

Figure 1:
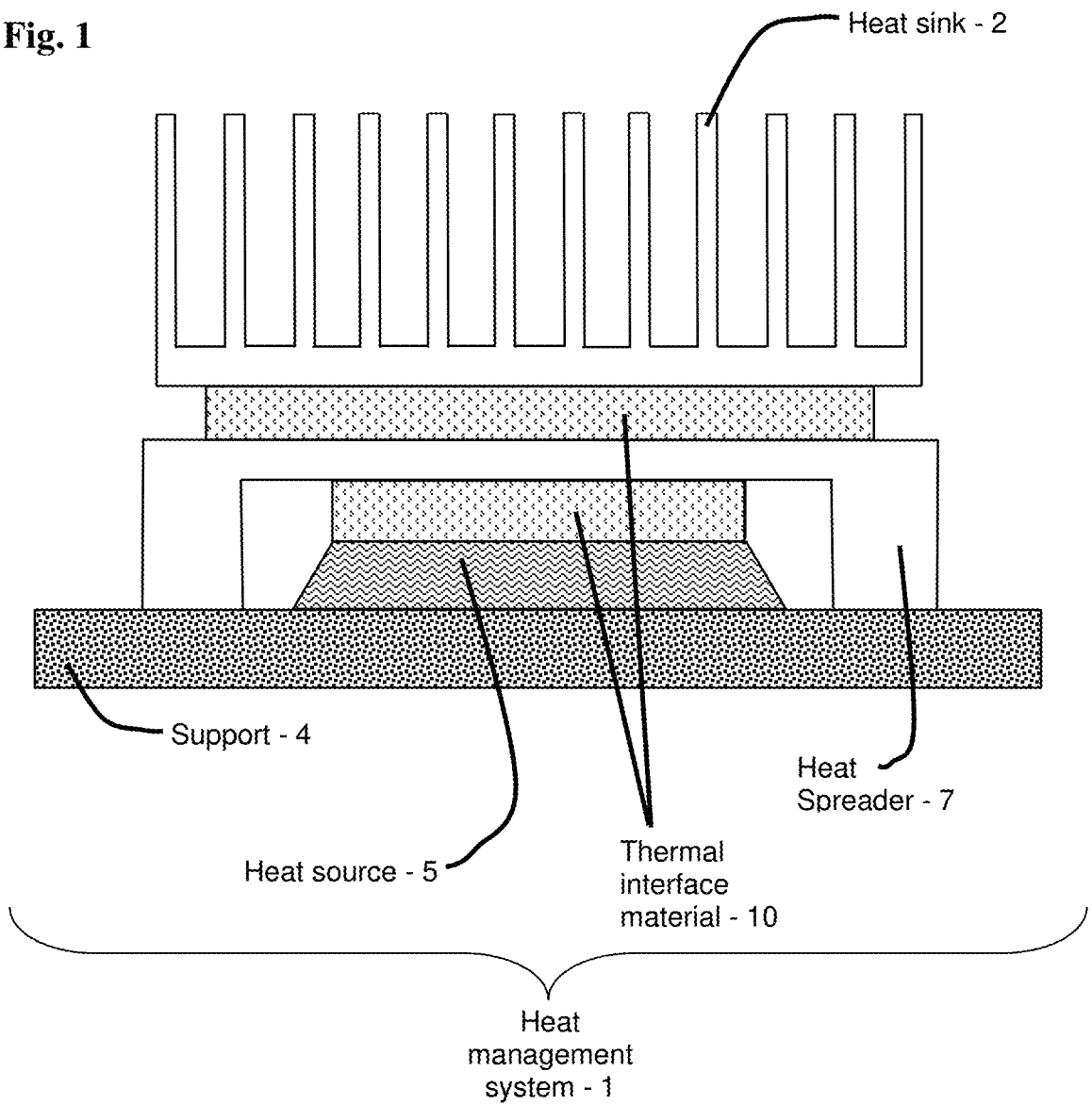
FIG. 1 is a schematic diagram depicting aspects of a heat generating component, a heat sink and use of thermal interface materials.

Disclosed herein are embodiments of thermal interface materials along with methods for fabricating and using the thermal interface materials. Generally, the thermal interface materials exhibit a high degree of heat conductivity and further provide anisotropic heat dissipation.

Prior to introducing the thermal interface materials (TIM), some terminology is provided to establish context for the teachings herein.

Generally, the term "self-healing" refers to materials that have the built-in ability to automatically repair damage to themselves without any external diagnosis of the problem or human intervention. Typically, conventional materials will degrade over time due to fatigue, environmental conditions, or damage incurred during operation. Cracks and other types of damage on a microscopic level have been shown to change thermal, electrical, and acoustical properties of the conventional materials, and the propagation of cracks can lead to eventual failure of the conventional material. In general, cracks are hard to detect at an early stage, and manual intervention is required for periodic inspections and repairs. In contrast, self-healing materials counter degradation through the initiation of a repair mechanism that responds to the micro-damage.

Generally, "thermal conductivity" (often denoted as k, λ, or K) refers to the ability of a material to conduct heat. Thermal conductivity is evaluated primarily in terms of Fourier's Law for heat conduction. In general, thermal conductivity is a tensor property, expressing the anisotropy of the property.

Heat transfer occurs at a lower rate in materials of low thermal conductivity than in materials of high thermal conductivity. Correspondingly, materials of high thermal conductivity are used in heat sink applications and materials of low thermal conductivity are used as thermal insulation. The thermal conductivity of a material may depend on temperature. The reciprocal of thermal conductivity is called "thermal resistivity."

Thermal conductivity may be expressed as provided in Eq. (1):

$$\text{a. } \vec{q} = (-k \vec{\Delta} T) \qquad \text{Eq. (1)}$$

where $\vec{q}$ represents the heat flux, -k represents the thermal conductivity, and $(\vec{\Delta} T)$ represents the temperature gradient.

Generally, as discussed herein, the term "thermal impedance" refers to the sum of thermal resistance and all contact resistances for a material. When thermal impedance is lower for a material, the material is a better thermal conductor in that application. Thus, factors such as surface roughness, surface flatness, clamping pressure, presence of adhesive, non-homogeneous, and material thickness are factors that influence thermal impedance for a material. Generally, thermal impedance is a useful metric for assessing thermal performance, as thermal impedance accounts for more variables specific to the application.

As used herein, an "isotropically oriented" set of elements is to be understood to be randomly or substantially randomly arranged such that the elements are not preferentially aligned or are not substantially preferentially aligned along a particular direction in space.

As used herein, an "anisotropically oriented" set of elements is to be understood to be arranged such that the elements are substantially preferentially aligned along a particular direction in space.

Referring now to FIG. 1, aspects of a heat management system for an electronic device are shown. In the heat management system 1 shown, a heat source 5 generates heat. Non-limiting examples of the heat source 5 include a least one of a processor, memory, a power supply, a power converter, a light emitting diode and a laser diode. Generally, the heat source 5 is mounted to a support 4. A non-limiting example of the support 4 is a printed circuit board (PCB). In this illustration, the heat source 5 is surface mounted onto the support 4. A first deposition of thermal interface material (TIM) 10 is directly on top of and in thermal communication with the heat source 5. A heat spreader 7 is disposed over the first deposition and in thermal communication therewith. On top of the heat spreader 7 and in thermal communication therewith is a second deposition of thermal interface material (TIM) 10. A heat sink 2 is disposed over the second deposition and in thermal communication therewith.

When energized, the heat source 5 generates heat. The heat is conducted away from the heat source 5 by the depositions of thermal interface material (TIM) 10 along with the heat spreader 7 and the heat sink 2. Generally, the depositions of thermal interface material (TIM) 10 enhance heat conduction between the heat source 5 and the heat sink 2 by elimination of gaps and air space between the components.

Generally, the heat sink 2 is a traditional cooling solution that maximizes the surface area (using fins or pins) and airflow (using fans) to dissipate heat from the heat source 5 out into the surrounding air. The heat sink 2 may be built with cooling fans as a simple, lightweight, and completely self-contained cooling solution. Depending on the available airflow, the heat sink 2 can often out-perform a similar sized heat spreader 7.

Generally, the heat spreader 7 has a large, flat surface on top. In some embodiments, the heat spreader 7 has no fan and no fins. The heat spreader 7 may be pressed directly up against another large flat surface (for example: the frame of a vehicle or the inside wall of a sealed container) and heat is allowed to pass from the heat spreader 7 out to the larger metal (thermally conductive) surface. In typical designs, the heat spreader 7 does not cool the heat source 5 (e.g., a CPU) alone. Rather, the heat spreader 7 is designed to transfer the heat to another object where it can safely dissipate away from the heat source 5. Generally, heat spreaders 7 are ideal for electronics systems that expect to operate under extreme shock and vibration, or systems that need to be completely sealed inside a container to be protected from the environment. Understandably, the performance of the heat sink 2 and the heat spreader 7, and thus the heat source 2 (such as a processor) may be substantially influenced by performance of the thermal interface material (TIM) 10.

It may be readily apparent that in the heat management system 1 of FIG. 1, having thermal interface material (TIM) 10 available as a pad may speed assembly and provide for consistent quality. That is, for example, dispending thermal interface material (TIM) 10 in the form of a grease or paste will require volume control as well as consistent spreading. In contrast, by designing the thermal interface material (TIM) 10 for implementation as a pad having suitable physical properties, superior quality control may be achieved.

Figure 2:
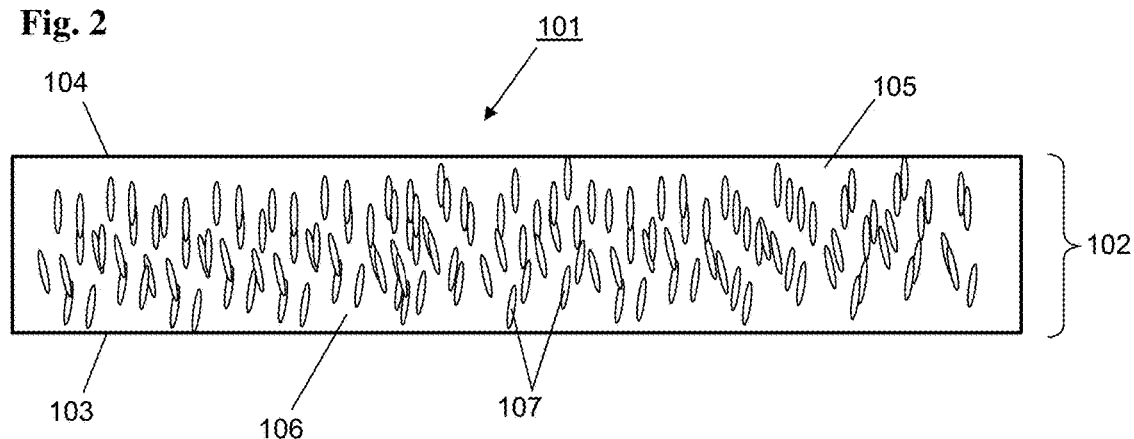
FIG. 2 is a schematic diagram of a thermal interface material pad.

Referring to FIG. 2, an example thermal interface material (TIM) 101 is shown. The TIM 101 is formed as a pad or sheet 102 extending between a first major surface 103 (as shown the bottom surface) and a second major surface 104 (as shown the top surface). Although a flat sheet is shown, it will be apparent to one skilled in the art that other shapes may be used, such as a curved sheet, or a sheet cut to custom shape and dimensions as desirable for a given application.

The sheet 102 is formed of a base material 105 with a thermally conductive filler material 106 embedded in the base material.

The base material 105 may be a material chosen to have desired mechanical and thermal properties. Numerous exemplary suitable materials are set forth below. For the purpose of the depicted exemplary embodiment, the base material will be considered to be an acrylic rubber or acrylic resin material. In some embodiments, the base material 105 may be a mixture of components such as resin combined with a plasticizer material.

Advantageously, in some embodiments, the base material may be free or substantially free of silicones or other siloxane-based polymers which are known to exhibit degradation, outgassing, and other undesirable properties at high temperature.

As shown, the filler material 106 may include anisotropically oriented thermally conductive elements 107. The thermally conductive elements 107 may be preferentially oriented along a primary direction from the first major surface 103 towards the second major surface 104 (as shown, the vertical direction) to promote thermal conduction though the sheet along the primary direction.

In some embodiments, the inclusion of the filler provides for excellent thermal conductivity through the sheet 102 along the primary direction. For example, in some embodiments, the thermal conductivity of the sheet along the primary direction is at least 10 W/mK, 15 W/mK 30 W/mK, 40 W/mK, 50 W/mK, 60 W/mK, 70 W/mK, 80 W/mK, 90 W/mK, 100 W/mK, or more. In some embodiments, the thermal conductivity may be measured using the ASTM standard D5470 known in the art.

In some embodiments, the TIM 101 exhibits excellent thermal impedance as a function of applied pressure. For example, in some embodiments this property may be measured using the techniques described in the ASTM standard D5470 known in the art, resulting in a thermal impedance at 10 psi pressure of less than $0.1°$ C.-inch$^2$/W, $0.09°$ C.-inch$^2$/W, $0.08°$ C.-inch$^2$/W, $0.07°$ C.-inch$^2$/W, $0.05°$ C.-inch$^2$/W, or less (e.g., for a sheet with thickness in the range of 0.5 mm to 5.0 mm). For example, in some embodiments this property may be measured using the techniques described in the ASTM standard D5470 known in the art, resulting in a thermal impedance at 30 psi pressure of less than $0.06°$ C.-inch$^2$/W, $0.05°$ C.-inch$^2$/W, $0.04°$ C.-inch$^2$/W, $0.03°$ C.-inch$^2$/W, $0.02°$ C.-inch$^2$/W, $0.01°$ C.-inch$^2$/W or less (e.g., for a sheet with thickness in the range of 0.5 mm to 5.0 mm).

In some embodiments, the sheet 102 may be self-supporting, e.g., formed from a flexible polymer resin base material 105. In some embodiments, the sheet may have a thickness in the range of 0.1 mm to 10 mm, or any subrange thereof, e.g., 0.5 mm to 5.0 mm. In some embodiments, TIM 101 may exhibit at Shore hardness in the range of 40 to 90 or any subrange thereof such as of 50 to 80 or 60 to 70, as determined by the techniques set forth in ASTM D2240 (Shore 00).

In some embodiments the TIM 101 may have a density in the range of 0.5 g/mL to 5.0 g/mL or any subrange thereof, e.g., 1.0 g/mL to 2.0 g/mL. In some embodiments, the TIM 101 may have a density of about 1.7 g/mL.

In some embodiments, the TIM 101 exhibits desirably high deflection as a function of applied pressure. In some such embodiments, this property allows for excellent thermal contact between the TIM 101 and other thermal sources and sinks in applications where pressure is applied. In some deflection as a function of compression may be measured using the techniques of the ASTM D5470 and ASTM C165 standards known in the art. In some embodiments, the TIM 102 exhibits a deflection of at least 10%, 20%, 30%, 40%, 50%, 60%, or more at a compression pressure of 30 psi, and a deflection of at least 30%, 40%, 50%, 60%, 70%, 80%, or more at a pressure of 50 psi.

In some embodiments, the TIM 101 can operate at temperature in the range of −40° C. to 150° C. without significant degradation. For example, in some embodiments the TIM 101 exhibits a total mass loss of less than 0.2% at temperatures at or above 150° C., 160° C., 170° C., 180° C., or more under thermogravimetric analysis using the techniques set forth in the ASTM E595 standard known in the art.

In some embodiments, the filler material may include ceramic flakes such as boron nitride flakes. In some embodiments, the filler material may include boron nitride nanoflakes or nanoscrolls.

In some embodiments, the filler material may include carbons such as graphite flakes or graphene flakes. In some embodiments, the filler material may include carbon nanotubes, bundles of carbon nanotubes, and agglomerates of aligned carbon nanotubes. Other suitable examples of filler material are presented in the examples below.

In some embodiments, the anisotropically oriented thermally conductive elements include flake shaped elements having a major surface, and at least 65%, 75%, 85%, 95%, 99% or more of the flake shaped elements are aligned such that the major surface substantially lies in a plane extending along the primary direction transverse to the first and second surfaces of the sheet. For example, as show in FIG. 2, the vast majority of the conductive elements are oriented such that the major surface of the flakes are oriented transverse to the top and bottom surface.

In some embodiments, the anisotropically oriented thermally conductive elements include elongated elements (e.g., carbon nanotubes) having a major dimension and one or more minor dimensions and wherein at least 65%, 75%, 85%, 95%, 99% or more of the elongated elements are aligned such that the major dimension extends along the primary direction transverse to the first and second surfaces of the sheet.

In various embodiments, the amount of filler material used may be selected to result in desired properties. In general, a larger amount of filler will tend to provide higher thermal conductivity (provided sufficient care in taken to ensure that the filler does not result in unwanted surface roughness, as detailed below). In some embodiments, the filler is at least 20%, 30% 40%, 50%, 60%, 70%, 80%, 90%, 95% or more by weight of the sheet.

Figure 3:
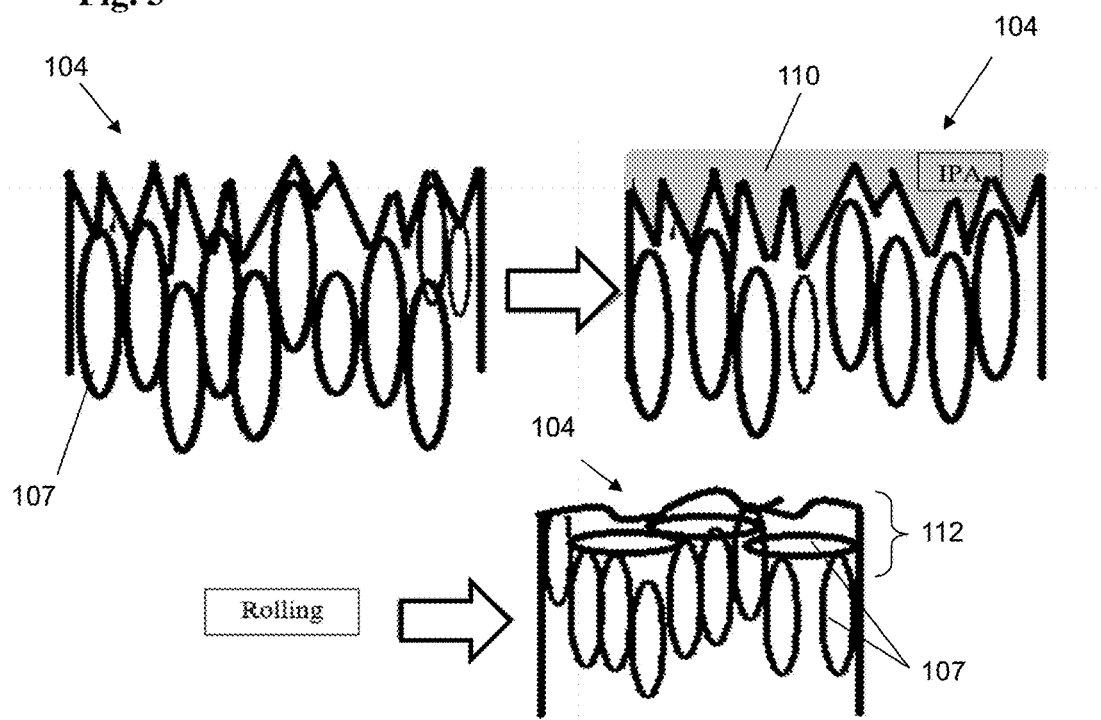
FIG. 3 is an illustration of a surface treatment for the thermal interface material pad of FIG. 2.

Referring to FIG. 3, in some embodiments, the presence of the filler material elements 107 embedded in the base material 105 may result in unwanted roughness of one or both of the major surfaces 103, 104 (104 is shown). In some such embodiments, the surface 104 may be treated to provide a smother surface, better suited for good thermal contact with objects such as heat sources and sinks, thereby reducing thermal impedance.

For example, in some embodiments, a solvent 110 may be applied (e.g., sprayed via a nozzle) onto the surface 104 to partially dissolve the base material. In embodiments where the base material 105 is an acrylic resin, isopropyl alcohol (IPA) is a suitable solvent choice. Pressure may then be applied to surface (e.g. using a mechanical roller or similar technique), smoothing the base material 105 and re-orienting the filler material elements 107 near the surface 104 to provide a smoother interface.

In some embodiments, following this surface treatment, the sheet 102 can include a region 112 proximal the first major surface 103 (not shown) and/or second major surface 104 (shown) of the sheet where the filler material elements 107 have been reoriented. This region 112 may then contain a subset of the thermally conductive elements 107 of the filler 106 are that less anisotropically oriented than the thermally conductive elements located more distal to the surface in the inner portion of the sheet. For example, with the base material 105 at least partially dissolved, the filler 106 in the region 112 may be freed to return to a more isotropic orientation.

Alternatively, the region 112 may then contain a subset of the thermally conductive elements 107 of the filler 106 that are anisotropically oriented along a different direction than the thermally conductive elements 107 located more distal to the surface in the inner portion of the sheet 102. For example, the pressure applied by a rolling element may cause the elements 107 near the surface 104 to be oriented flat along the surface rather than extending transverse to the surface.

In some embodiments, heat may be applied to the surface 103, 104 instead of or in addition to the solvent 110 to soften or melt the base material in the region 112.

In some embodiments, additionally or in the alternative to the surface treatments described above, a thin layer of adhesive material (not shown) may be applied to the surface 103, 104 (e.g., using a spray nozzle). The adhesive layer can fill in surface roughness and promote adhesion of the TIM 101 to heat sources or sinks. In some embodiments, the adhesive material may include a space filling material (e.g., a material otherwise suitable for use as the base material, such as an acrylic rubber). For example, in some embodiments the space filling material may be dissolved in a solvent and sprayed on to the surface 104 to fill in gaps, cracks, indentations of the like in the surface 104. In some examples, the solvent may then dry, leaving the space filling material behind, thereby creating a smoother surface 103, 104 on the sheet 102.

Figure 4:
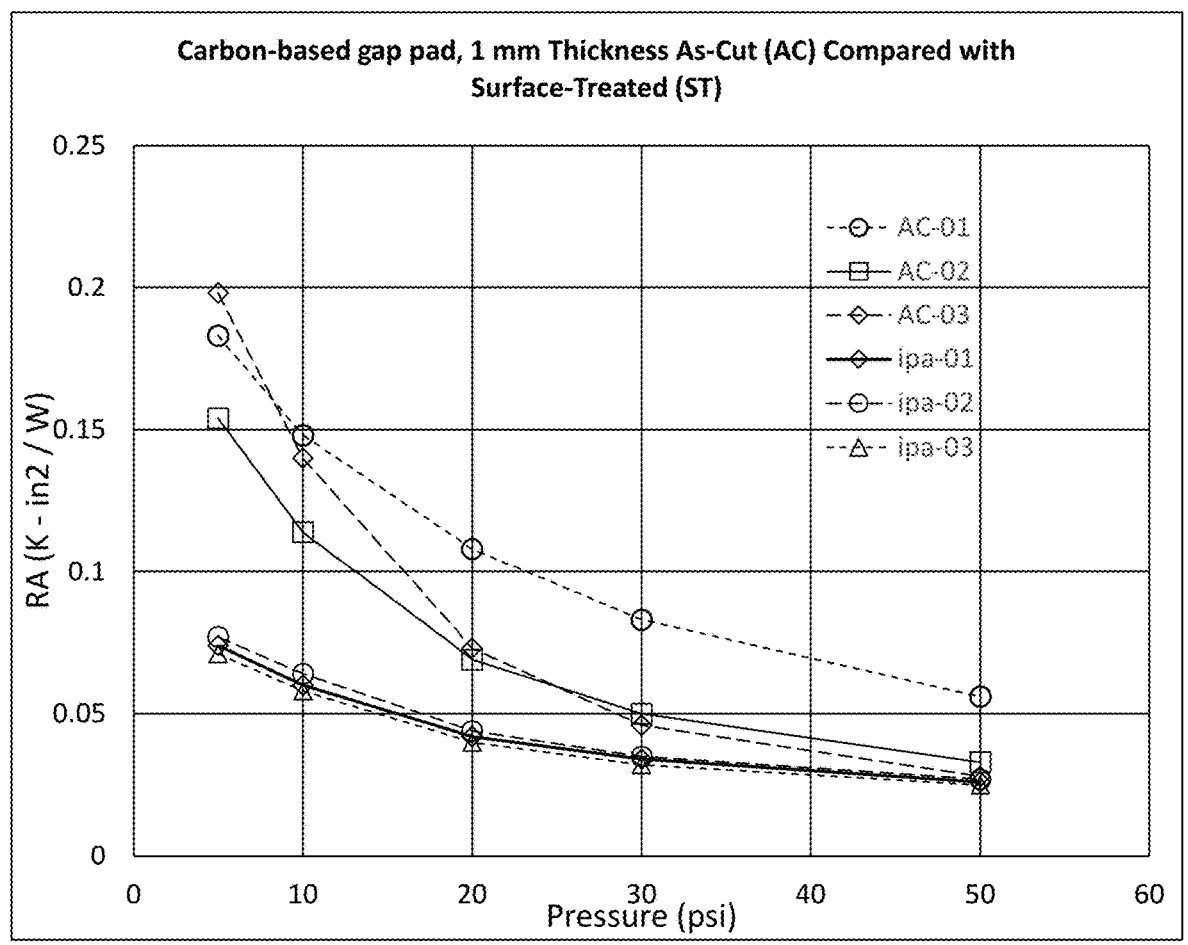
FIG. 4 is a plot of thermal impedance vs. pressure for six samples of thermal interface material pads. The upper three traces show results for samples without surface treatment. The lower three traces show results for samples with surface treatment of the type illustrated in FIG. 3.

FIG. 4 illustrates the benefits of the solvent based surface treatment described above. Six samples of the TIM 101 were made, each having a thickness of 1.0 mm. The samples were tested for thermal impedance at various pressures, using the techniques set forth in the ASTM standard D5470 know in the art. Three of the samples underwent surface treatment to improve surface treatment, three did not. As shown in FIG. 4, the thermal impedance for the treated samples (lower traces) was less than that of the untreated samples (upper traces), especially at low pressure. This clearly indicates that the surface treatment promotes better thermal contact between the TIM 101 and the heat sources and sinks used in the evaluation.

Figure 5:
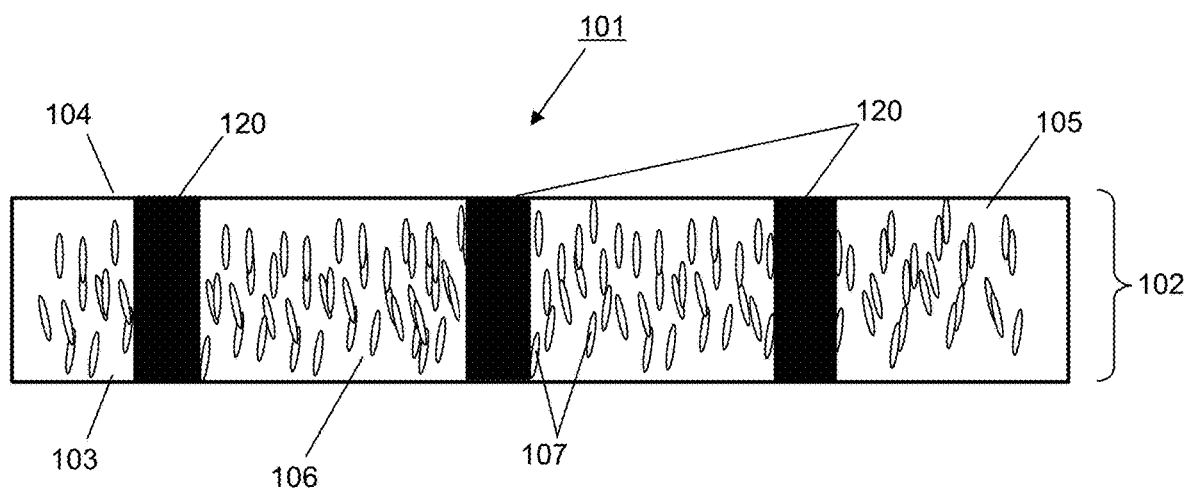
FIG. 5 is a schematic diagram of an alternate embodiments thermal interface material pad.

Referring to FIG. 5, in some embodiments, the TIM 101 includes additional thermally conductive elements 120 extending through the sheet 102 from the first major surface 103 to the second major surface 104 along the primary direction (as shown the vertical direction). These additional thermally conductive elements 20 may promote heat flow between the surfaces 103, 104. In some embodiments, these additional thermally conductive elements 120 may be made of carbon. For example, graphite or graphene formed as sheets, strips, pillars, or other suitable shapes may be used.

In some embodiments, a portion of the thermally conductive elements may be exposed at the first and second major surfaces 103, 104 of the sheet 102. In some such cases it may be desirable to treat the surface to protect these regions, e.g., by using the solvent based surface treatment described above, or by applying a thin protective adhesive layer to the surfaces 103, 104.

Figure 6A:
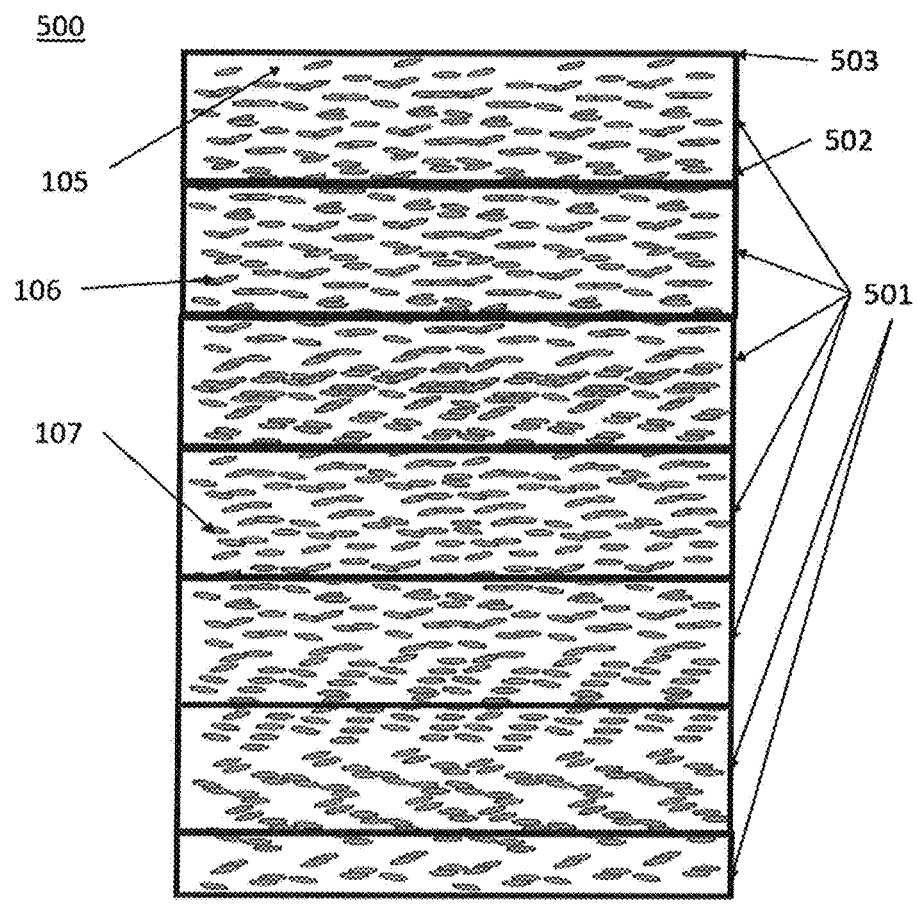
FIG. 6A is an illustration of the initial steps in a method of fabrication of a thermal interface pad of the type shown in FIG. 2.

Referring to FIGS. 6A and 6B, an exemplary method for fabricating the TIM 101 is shown.

Referring to FIG. 6A, a stack 500 is formed at includes a plurality of layers 501.

Each layer 501, as shown each layer 501 extends from a bottom surface 502 to a top surface 503 along a direction (as shown, the vertical direction), and the layers are stacked one above the other in that direction.

Each layer 501 includes a base material 105, and a filler material 106 of the type described above with reference to FIG. 2. The filler material 106 in each layer is made up of anisotropically oriented thermally conductive elements 107. However, unlike in the sheet 102 used in the final TIM 101, the elements 107 are oriented to promote heat flow directions transverse to the vertical direction from the bottom surface 502 to the top surface 503 rather than along it. Accordingly, these layers 501 in the stack are not suitable for use as the TIM 101 without further processing.

Referring to FIG. 6B, accordingly, in some embodiments, force may be applied (optionally along with heat) in the vertical direction to compress the stack 500 to cause the layers 501 to join together to form a monolithic element. The stack 501 may be sliced, e.g. using a fine blade, or ultrasonic or laser cutting along a plane extending in the vertical direction (indicated in FIG. 6B with a heavy dark arrow) to form a sheet 102 of a desired thickness. This sheet 102 is removed from the stack, and forms TIM 101. Notably, the TIM 101 now includes a sheet 102 having filler material 106 made up of anisotropically oriented thermally conductive elements 107 oriented in the proper direction. That is, the sheet 102 extends between a first major surface 103 and an second major surface 104, and the filler material 106 includes anisotropically oriented thermally conductive elements 107 that are preferentially oriented along a primary direction from the first major surface 103 towards the second major surface 104 to promote thermal conduction though the sheet 102 along the primary direction.

Additional slices may be taken to generate additional TIM 101 pads. In other words, the stacking and slicing process described above takes a plurality of layers in which the filler material has an anisotropic orientation in a direction unsuitable for use as a TIM 101, and generates a number of TIM 101 pads with the filler having the desired orientation.

As described in detail below, the layers 501 can be generated using a simple process suitable for mass production techniques. For example, in some embodiments each stack layer 501 can be formed by providing a mixture of base material and filler material that includes the thermally conductive elements. In general, this mixture can be made without taking any steps to orient the filler material, resulting in an isotropic distribution of the thermally conductive elements in the base material. The resulting mixture can then be physically manipulated to cause the thermally conductive elements to become anisotropically oriented within the layer. For example, as described in detail in the additional examples below, the mixture can be extruded to form the layers 501, compressed to form the layers 501, repeatedly folded on itself to form the layer 501, or combinations thereof.

As described above, this physical manipulation will result in a layer having anisotropically oriented thermally conductive elements 107 oriented in an undesirable direction for use in the TIM 101. However, this can be rectified by performing the stacking, compression, and slicing steps describe above with reference to FIGS. 6A and 6B In some embodiments, the base material 105 is a self-healing material, thereby promoting the melding of the layers 501 into a monolithic element during the compression step provided above. Self healing materials are also advantageous in that they resist damage (e.g., cracking) that may occur during the slicing step described above with reference to FIG. 6B.

In various embodiments, the method may further include applying a surface treatment to one or more of the major surfaces 103, 104 of the TIM 101, as described above with reference to FIG. 3.

Figure 7A:
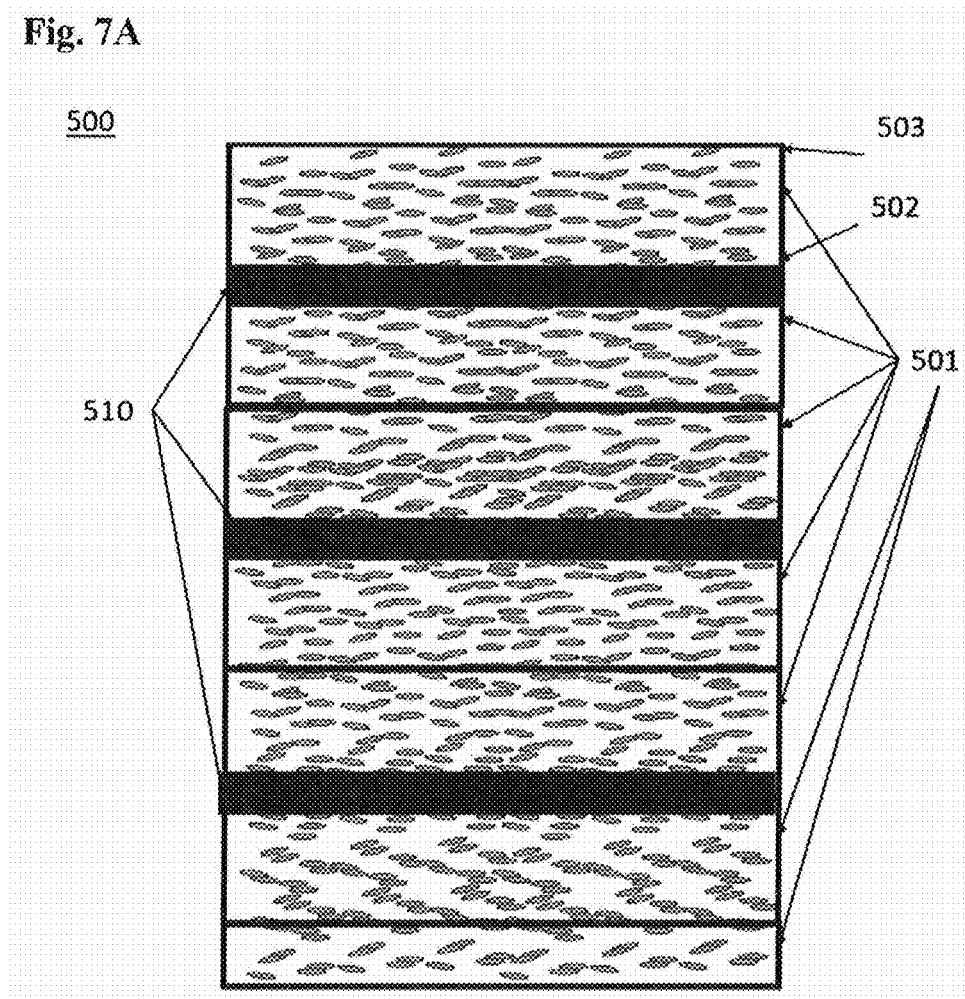
FIG. 7A is an illustration of the initial steps in a method of fabrication of a thermal interface pad of the type shown in FIG. 5.
Figure 7B:
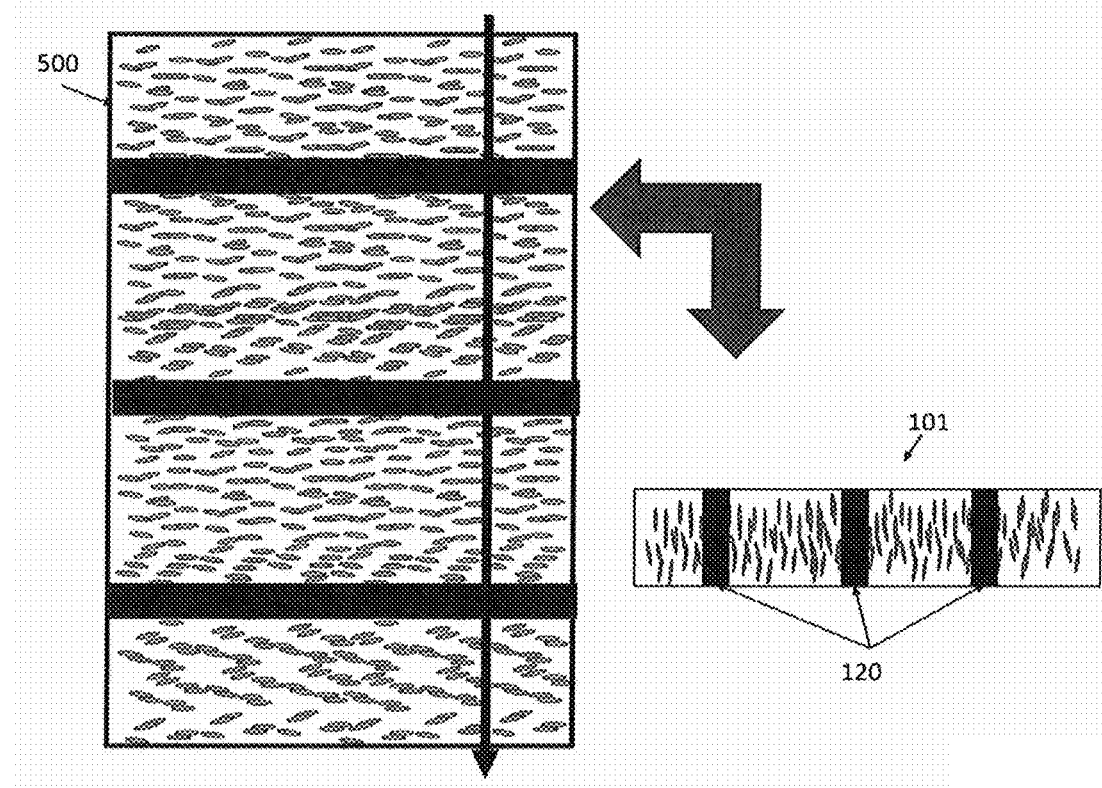
FIG. 7B is an illustration of the final steps in a method of fabrication of a thermal interface pad of the type shown in FIG. 5.

Referring to FIGS. 7A and 7B, the above process can be easily modified to produce the alternate version of TIM 101 shown in FIG. 5. In some embodiments, conductive elements, e.g., carbon elements 510 are interleaved between a least some of the layers 501 in the stack 501 prior to the steps of compressing and slicing the stack.

The carbon elements may include graphite or graphene and may be formed as sheets (e.g., extending continuously across the surface of the layers 501) or strips (e.g. covering only portions of the layers 501) or any other suitable shape. In some embodiments, the carbon elements 501 may be formed of graphite or graphene.

As shown in FIG. 7B, once the stack 500 is sliced to form the sheet 102 of the TIM 101, portions of the carbon elements 520 form the additional thermally conductive elements 120 extending through the sheet 102 from the first major surface 103 to the second major surface 104 as descried above with reference to FIG. 5.

As will be apparent to one skilled in the art, the above process can be readily adapted to provide a TIM 101 of any of the types described herein.

Note that although FIGS. 6A-7A show a specific number of layers 501 and conductive elements 510, and suitable number may be used. For example, some embodiments use 2, 3, 4, 5, 10, 15, 20 or more layers 501, e.g., in the range of 2-100 layers or a subrange thereof.

Additional Examples

A process for fabrication of an exemplary TIM pad is set forth with regard to FIGS. 8-11. As will be apparent to one skilled in the art, the exemplary material and techniques describes herein may be readily adapted for use in the previous examples a well.

Figure 8:
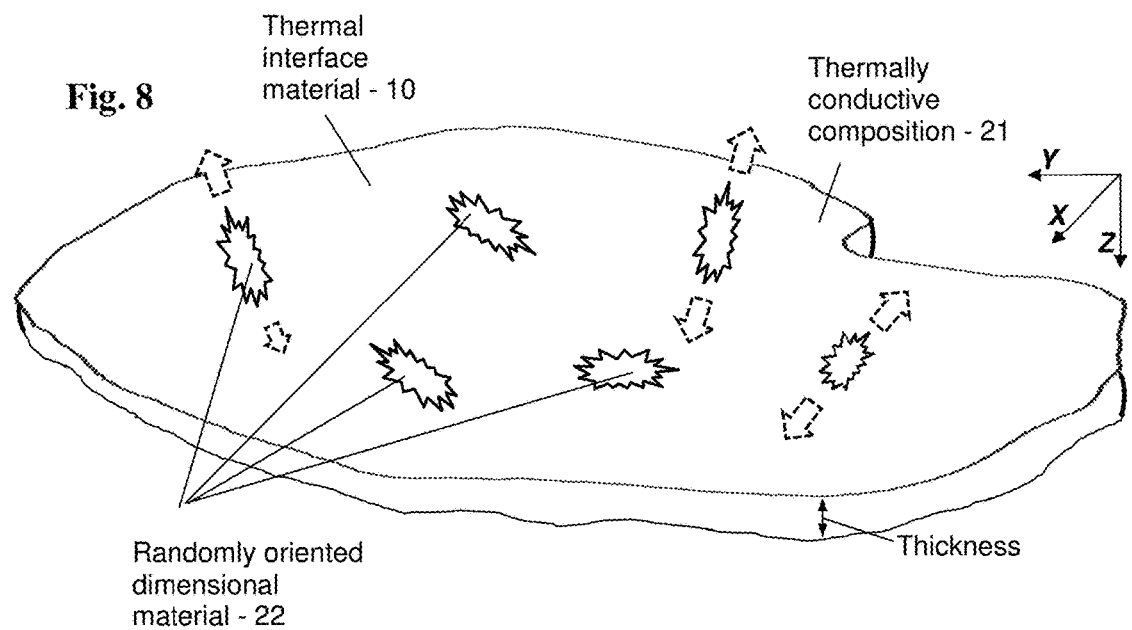
FIG. 8 is a schematic diagram depicting aspects of another example of thermal interface material that includes a dispersion of dimensional material.

The process for fabricating a pad of thermal interface material (TIM) 10 begins with what is shown in FIG. 8.

In FIG. 8, a volume of a suitable thermally conductive composition 21 is shown. The thermally conductive composition 21 may include fillers for example, metal powder and mixtures thereof (for example, aluminum powder; silver powder; copper powder); graphite flakes, ceramic powder (for example, alumina; boron nitride and others). The composition 21 may also include a self supporting base material that includes materials such as rubbers (e.g., acrylic rubber), oils, polymers, thermoplastic resins and thermoset resins. Generally, the thermally conductive composition 21 may be fabricated from materials exhibiting suitable properties. The properties may include, for example, pliability and good thermal conductivity. A variety of other materials may be used.

In some embodiments, a thermoplastic resin that is substantially solid at room temperature is used. Some examples of suitable thermoplastic resins include, acrylic resin, epoxy resin, silicone resin, fluorine resin and the like. These may be used alone, or in combination with other materials (as practicable).

The thermoplastic resin may be used in combination with a solid. Thermoplastic polymers/resins which may be used include, for example, poly (2-ethylhexyl acrylate), 2-ethylhexyl acrylate-acrylic acid copolymer, a polymethacrylic acid or its ester, an acrylic resin such as a polyacrylic acid or its ester; silicone resins; fluororesins; polyethylene; polypropylene; ethylene-propylene copolymer; polymethylpentene; polyvinyl chloride; polyvinyl acetate; ethylene-vinyl acetate copolymer; polyvinyl alcohol; polyacetal; polyethylene terephthalate; polyethylene; polystyrene; polyacrylonitrile; -styrene acrylonitrile copolymer; acrylonitrile-butadiene-styrene (ABS resin)—copolymer; styrene butadiene block copolymer or its hydrogenated product; styrene-isoprene block co-polymer copolymer or its hydrogenated product; polyphenylene ether; modified polyphenylene ether; aliphatic polyamide; and aromatic polyamides; polyamide; polycarbonate; polyphenylene sulfide; polysulfone; polyethersulfone; polyethemitrile; polyetherketones; polyketone; polyurethane; liquid crystal polymer; ionomers; and the like. These may be used alone, or in combination with other materials (as practicable).

In some embodiments, a thermoplastic fluorocarbon resin is used. This may result in certain other advantages, such as improved heat resistance, oil resistance, and chemical resistance.

Solid thermoplastic fluororesin that may be useful include, for example, vinylidene fluoride, tetrafluoroethylene-propylene, tetrafluoroethylene-system or the like, fluorine-containing polymerizable monomer of the resulting elastomer and the like. More specifically, a poly-tetrafluoroethylene, a tetrafluoroethylene-perfluoroalkylvinyl ether copolymer, tetrafluoroethylene-hexafluoropropylene copolymer, tetrafluoroethylene-ethylene copolymer, polyvinylidene fluoride, polychlorotrifluoroethylene, ethylene-copolymer, tetrafluoroethylene-copolymer, polyvinylfluorides, tetrafluoroethylene-propylene copolymer, tetrafluoroethylene-hexa-fluoropropylene copolymer, acrylic-modified polytetrafluoroethylene, polytetrafluoroethylene modified ester, epoxy-modified silane-modified polytetrafluoroethylene and polytetrafluoroethylene and the like.

Additional materials that may be used as the thermoset resin include, for example, natural rubber; acrylate rubber; butadiene rubber; isoprene rubber; nitrile rubber; hydrogenated nitrile rubber; chloroprene rubber; ethylene-propylene rubber; chlorinated polyethylene; chlorosulfonated polyethylene; butyl rubber; halogenated butyl rubber; polyisobutylene rubber; polyacrylic rubber; epoxy resin; a polyimide resin; a bismaleimide resin; benzocyclobutene resin; a phenol resin; unsaturated polyester; a diallyl phthalate resin; a polyimide resin; a polyurethane; a thermosetting polyphenylene ether; thermosetting polyphenylene ether; and the like.

In some embodiments, the thermally conductive composition 21 includes poly(vinyl acetate) (PVA) or poly(ethenyl ethanoate) (PVAc). Generally, PVA is an aliphatic rubbery synthetic polymer with the formula $(C4H6O2)_n$. PVA belongs to the polyvinyl esters family, with the general formula —[RCOOCHCH$_2$]— and is a type of thermoplastic. In some embodiments, the thermally conductive composition 21 is a non-silicone base material. One additional example includes a soy-oil base material.

Any of the foregoing materials may be used alone, or in combination with these or other materials (as practicable).

Disposed within the thermally conductive composition 21 is a dispersion of thermal fillers. The thermal fillers may be provided as nanomaterials and/or micromaterials.

Generally, the thermal fillers exhibit some shape or form, and therefore have at least one dimensional aspect (e.g., thin flakes having a major surface and on minor dimension or elongated elements having one major dimension and two transverse minor dimensions). The thermal fillers may be selected for dispersion and exhibit good to excellent thermal conductivity. Some examples of nanomaterials include, without limitation, such as forms of carbon nanotubes (including single-wall carbon nanotubes (SWCNT) and multi-wall carbon nanotubes (MWCNT)) as well as nanohoms, nano-onions, carbon black, fullerene, graphene, oxidized graphene, and various treated forms of the foregoing. In some embodiments, the nanomaterials further include metal nano-particles, metal oxide nano-particles, and/or at least one form of thermally conductive polymer. The thermal fillers may be provided as micromaterials and include, without limitation, graphite, boron nitride, boron nitride flakes, boron nitride nanoscrolls, aluminum nitride, aluminum nitride whiskers, carbon nanotubes, metal particles, metal oxide particles and/or at least one form of thermally conductive polymer.

As used herein, the term "micromaterials" refers to dimensional thermal filler materials that exhibit one or more dimension in the range of about 0.1 microns up to about 200 microns (e.g., microscale particles or flakes). Generally, the term "nanomaterials" refers to dimensional thermal filler materials that exhibit a one or more dimensions in the range of about a few nanometers up to about 100 nanometers (0.1 microns) (e.g., nanotubes, nanorods, nanoparticles, nanoshells, nanohorns, and nanoscopic flakes such as graphene flakes).

Given the diminutive nature of the thermal fillers, in some embodiments, it is not possible to control orientation when mixing them into the thermally conductive composition 21. Accordingly, dispersion of the thermal fillers results in randomly oriented dimensional material 22 disposed within the volume of the thermally conductive composition 21.

As the thermal fillers are randomly oriented within the thermally conductive composition 21, advantageous properties of directional thermal conductivity are absent. More specifically, and as shown in FIG. 8 by the directional arrows, without a directional arrangement, the isotropic thermal conductivity preference of the thermal fillers causes heat to be conducted away in random directions. The potential of the thermal fillers may be taken advantage of, however, when rearranging the dimensional thermal fillers in an anisotropic orientation to form an oriented material 100, as shown in FIG. 9.

Figure 9:
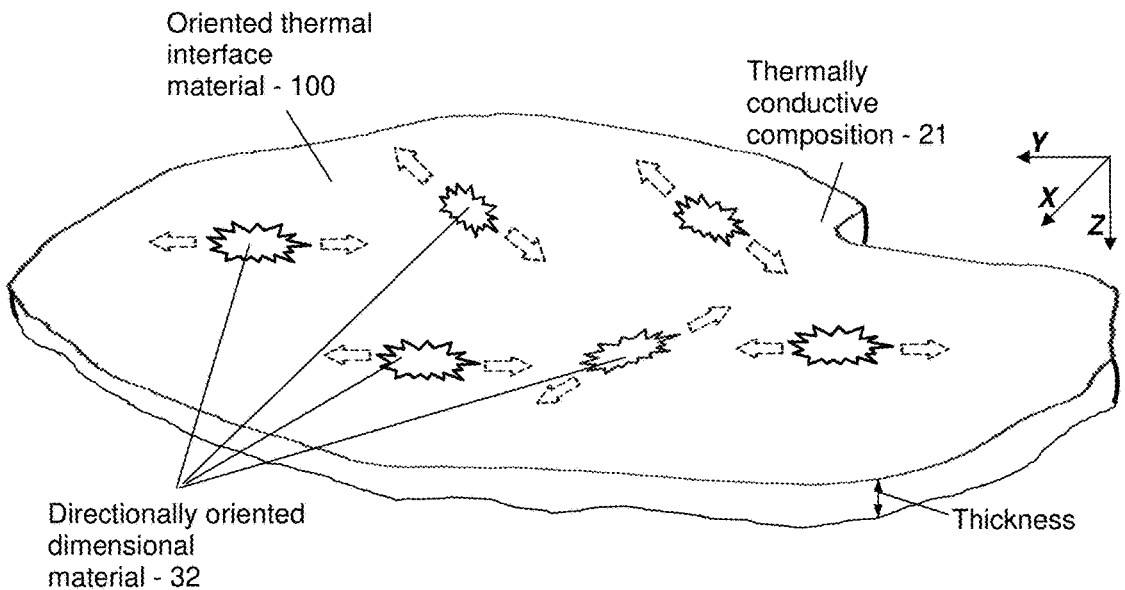
FIG. 9 is a schematic diagram depicting aspects of another example of thermal interface material that includes a dispersion of dimensionally oriented materials.

As shown in FIG. 9, the thermal fillers dispersed in the thermally conductive composition 21 may be arranged as directionally oriented dimensional material 32 in the oriented material layer 100, e.g., suitable for use as layers 501 in the stack and slice process described above with reference to FIGS. 6A through 7B.

Exemplary techniques for providing oriented dimensional material 32 include hydraulic pressing or extrusion. In some embodiments, hydraulic pressing begins with a volume of thermal conductive composition 21 having a dispersion of randomly oriented dimensional material 22. The volume of material is pressed or extruded into a substantially planar form. In some embodiments, the substantially planar form is then folded onto itself, effectively being reshaped, e.g., into a ball or cubic volume. The volume of material is then again pressed into a substantially planar form. Generally, through repeated pressing and folding, the filler materials disposed in random orientation are encouraged into a planar orientation, e.g., as shown above in the layers 501 in reference to FIG. 6A or FIG. 6B.

In order to encourage migration of the filler materials into the desired orientation, the mixture of the thermally conductive composition 21 with the dispersion of randomly oriented dimensional material 22 may be heated, e.g., during a pressing or extrusion process as described above. Generally, heating of the mixture of the thermally conductive composition 21 with the dispersion of randomly oriented dimensional material 22 decreases the viscosity of the thermally conductive composition 21, thereby encouraging migration of the randomly oriented dimensional material 22 into the desired orientation.

Figure 10:
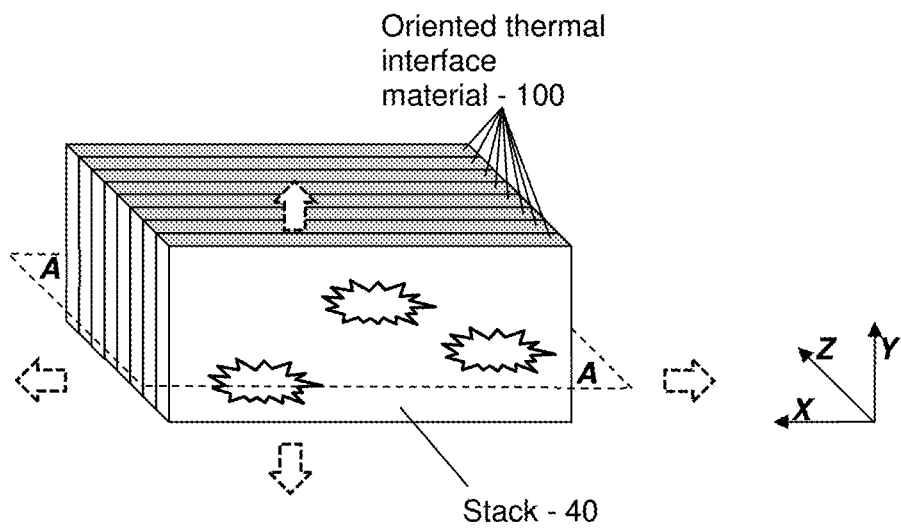
FIG. 10 is a depiction of a block of stacked thermal interface material layers, each layer made up of a dispersion of dimensionally oriented materials such as those shown in FIG. 9.

As shown in FIG. 9 by the directional arrows, when the dimensional materials 32 are provided in a directional arrangement, the anisotropic thermal conductivity preference of the nanomaterials generally causes heat to be conducted away in the X-Y plane. This property is taken advantage of to provide for thermal pad disclosed herein. In some embodiments As shown in FIG. 10, the oriented material 100 may be segmented and placed into a stack 40. Once in the stack 40, the oriented thermal interface material (TIM) 100 may be further segmented. For example, the stack 40 may be cut along an imaginary plane, denoted as the A-plane, which is in the X-Z plane. The result is depicted in FIG. 11.

Figure 11:
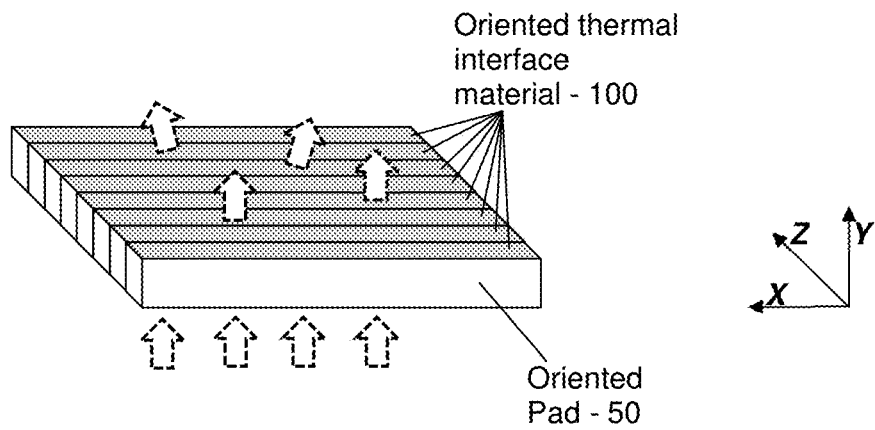
FIG. 11 is a depiction of a thermal interface material pad containing dimensionally oriented material, which could be cut from a block like that shown in FIG. 10.

As shown in FIG. 11, an oriented pad 50 includes a portion of the stack 40 shown in FIG. 4. Generally, the oriented pad 50 is fabricated to dimensions suited for use in the heat management system 1 illustrated in FIG. 1. The resulting vectors substantially convey heat from the heat source 5 through the X-Y plane. While some of the thermal fillers will convey heat substantially in the X direction, it is expected that a substantially equivalent portion of the nanomaterials will convey heat substantially in the Y direction. Stated another way, while the anisotropic thermal conductivity of the thermal fillers causes a substantial portion of the heat to be conveyed through the X-Y plane, conveyance of heat in the Z direction is limited (for the same reason). Thus, there is limited recirculation of heat within the oriented pad 50.

Performance of the thermal conductivity of the oriented pad 50 was evaluated in a series of tests using a standardized test bench. Testing included comparison to competitive products. When placed in the test bench, each product experienced some compression. The compression exhibited is set forth in Table 1 below. In the data table below, "NaL Pad" refers to the oriented pad 50. Test data for evaluation of thermal conductivity is presented in FIG. 12.

TABLE 1

Compression of comparative products

| TIM | Thickness (mm) | | Change |
|---|---|---|---|
| Description | Before | After | (%) |
| t-Global, 2 w/mK | 1.94 | 1.87 | −3.61 |
| t-Global, 6 w/mK | 2.03 | 2.025 | −0.25 |
| Panasonic, 13 w/mK | 2.02 | 2 | −0.99 |
| Fujipoly, 17 w/mK | 1.5 | 1.475 | −1.67 |
| NaL Pad, Rough | 1.755 | 1.69 | −3.70 |
| NaL Pad, Flat | 1.36 | 1.35 | −0.74 |

Figure 12:
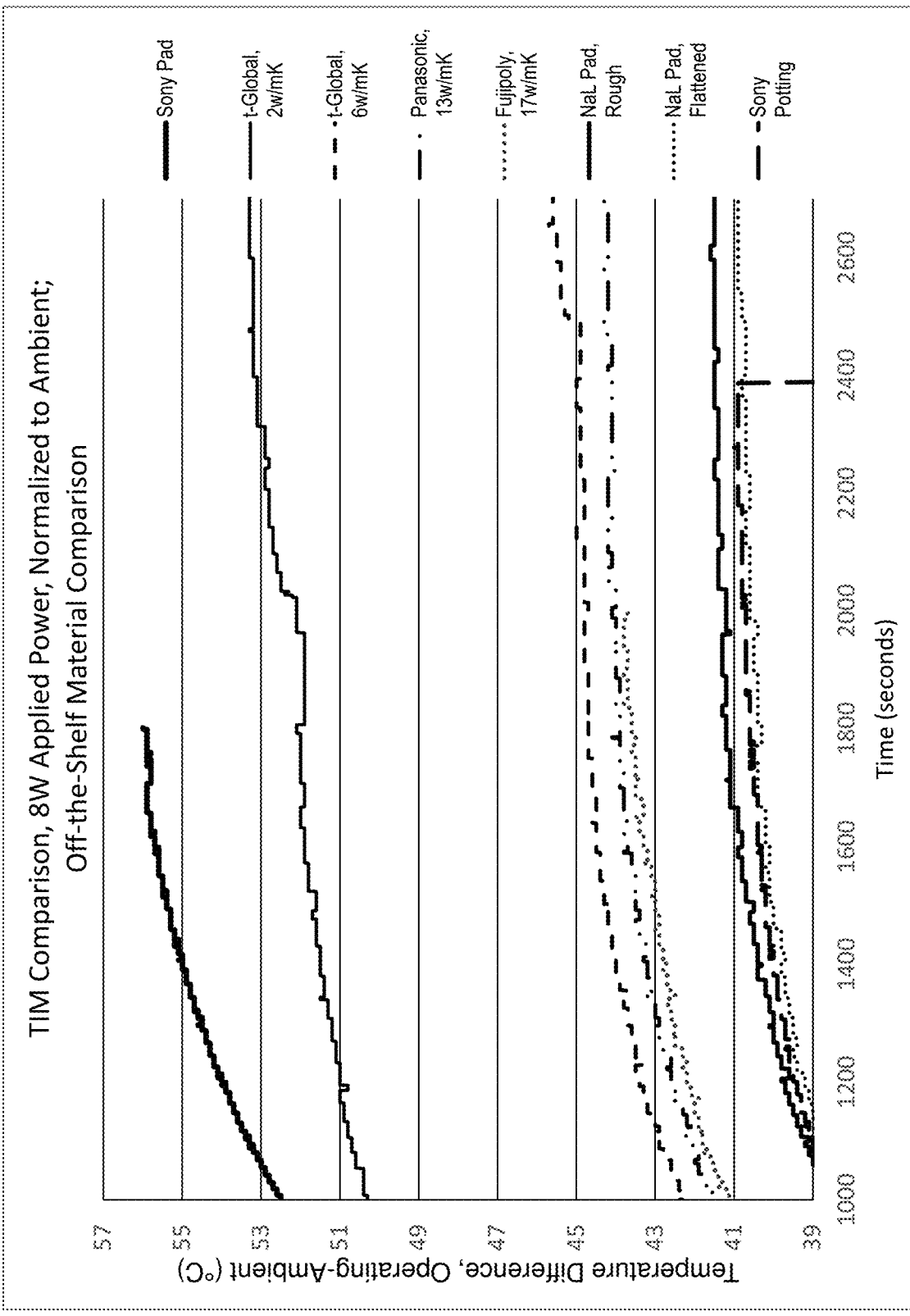
FIG. 12 is a graph depicting thermal performance for the oriented pad disclosed herein in comparison to competitive products; and, FIG. 13 is graph showing comparative performance of embodiments of thermal interface materials.

As shown in FIG. 12, the resulting oriented pad 50 outperforms all competing pad products tested. The data shows that thermal conductivity performance of the oriented pad 50 is substantially equivalent to thermal performance of potting material (i.e., jacketing of the heat source 5 with potting material).

Figure 13:
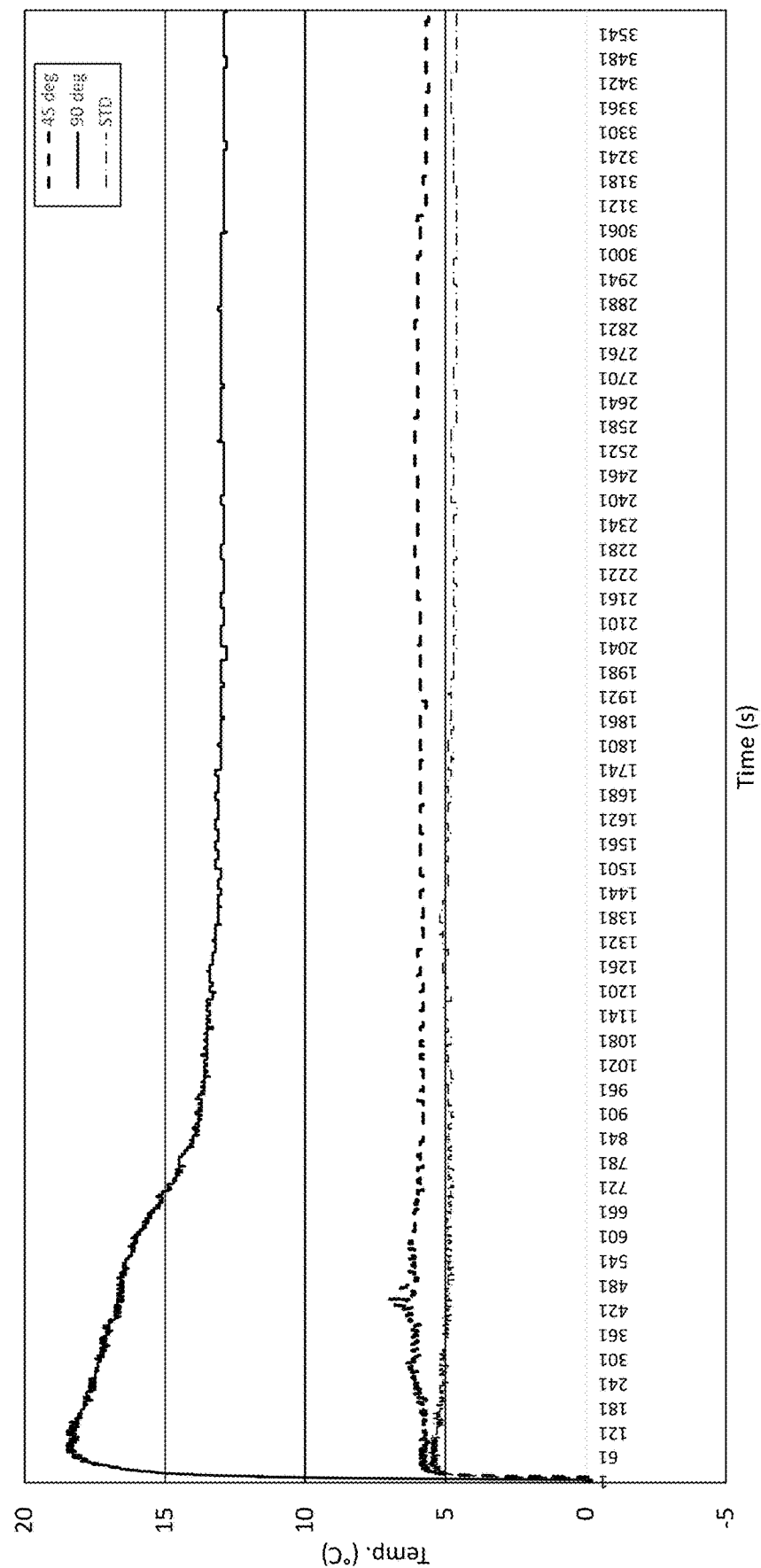

In FIG. 13, a comparison showing the effects realized from orientation of the dimensional thermal materials is shown. In the heat management system 1 used to generate the data shown, the heat spreader 7 was omitted. Three samples of thermal interface material 10 were tested. The first sample included a standard (STD) with substantially vertically oriented thermal filler materials. A difference in temperature between the heat source 5 and the heat sink 2 reached equilibrium quickly and maintained at about 5° C. The second sample of thermal interface material 10 (45 deg) was fabricated using a slicing technique described herein, with slicing occurring at an angle of about 45 degrees. The third sample of thermal interface material 10 contained thermal filler materials that were oriented substantially orthogonally (90 deg) to the desired direction of heat flux.

Exhibiting a smaller temperature difference between the heat source 5 and the heat sink 2 indicates lower thermal resistivity. Thus, since the first sample has the smallest temperature difference, it is clear that orienting the particles such that heat is transferred through the X-Y plane (as defined in FIG. 11) improves the thermal conductivity of the thermal interface material 10.

Having introduced aspects of thermal interface materials, some further aspects and examples are provided.

The thermal interface materials may be formed as a soft material. Generally, the thermal interface material is self-healing during fabrication (the slice-and-stack procedure).

Generally, the thermal interface material is useful in applications requiring gap filling. That it, the thermal interface materials provide for superior conformity to irregular surfaces.

In some embodiments, the thermal interface materials include a flexible polymer sheet material with thickness options from about 0.25 mm to about 5 mm, and a thermal conductivity of up to about 60 W/mK or more. Current high-performance TIM sheets tend to be around 5 W/mK. The resulting four-fold increase in performance is an enabling technology for applications using high power. Virtually any powered system could take advantage of a high performance TIM.

Applications for thermal interface materials include, without limitation: power supplies, automotive electronics, motor controls, power semiconductors, heat sink interfaces, processing systems and other electronic devices such as computers, amplifiers, video processing equipment, control systems and many others.

In some embodiments, the resulting product exhibits thermal conductivity that is at least 60 W/mK. The product may be provided in a sheet, in some embodiments, in sheets sized roughly the size of standard printer paper. The product may have a thickness of between about 0.25 mm to 5 mm and may be lesser or greater in thickness. The product may be useful in temperatures ranging between −60° C. to 250° C. (or any subrange thereof, e.g., −40° C. to 150° C.) and may be useful in temperature ranges lesser or greater. Generally, the product is non-outgassing and does not exhibit creep with thermal cycling. Generally, the product is pliable and conforming to surrounding components. Generally, the product is reworkable and may be use in existing/common manufacturing processes.

Various other components may be included and called upon for providing for aspects of the teachings herein. For example, additional materials, combinations of materials and/or omission of materials may be used to provide for added embodiments that are within the scope of the teachings herein.

A variety of modifications of the teachings herein may be realized. Generally, modifications may be designed according to the needs of a user, designer, manufacturer or other similarly interested party. The modifications may be intended to meet a particular standard of performance considered important by that party.

The appended claims or claim elements should not be construed to invoke 35 U.S.C. § 112(f) unless the words "means for" or "step for" are explicitly used in the particular claim.

When introducing elements of the present invention or the embodiment(s) thereof, the articles "a," "an," and "the" are intended to mean that there are one or more of the elements. Similarly, the adjective "another," when used to introduce an element, is intended to mean one or more elements. The terms "including" and "having" are intended to be inclusive such that there may be additional elements other than the listed elements. As used herein, the term "exemplary" is not intended to imply a superlative example. Rather, "exemplary" refers to an embodiment that is one of many possible embodiments.

While the invention has been described with reference to exemplary embodiments, it will be understood by those skilled in the art that various changes may be made and equivalents may be substituted for elements thereof without departing from the scope of the invention. In addition, many modifications will be appreciated by those skilled in the art to adapt a particular instrument, situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A thermal interface material comprising:
    a sheet extending between a first major surface and a second major surface, the sheet comprising:
        a base material; and
        a filler material embedded in the base material comprising anisotropically oriented thermally conductive elements;
    wherein the thermally conductive elements are oriented along a primary direction from the first major surface towards the second major surface to promote thermal conduction though the sheet along the primary direction;
    wherein the base material is substantially free of silicone;
    wherein the thermal conductivity of the sheet along the primary direction is at least 20 W/mK; and wherein the thermal interface material comprises carbon elements continuously extending through the sheet from the first major surface to the second major surface along the primary direction and configured to promote heat flow from the first surface to the second surface.

2. The thermal interface material of claim 1, wherein the sheet comprises a slice separated from a stack of a plurality of layers of base material compressed together,
    each of said layers is embedded with filler material, and wherein the filler material in each layer comprises anisotropically oriented thermally conductive elements;
    wherein the orientation of the slice during separation from the stack is such that the B thermally conductive elements are oriented along a primary direction from the first major surface towards the second major surface to promote thermal conduction though the sheet along the primary direction.

3. The thermal interface material of claim 1, wherein the base material comprises a self-supporting flexible layer.

4. The thermal interface material of claim 1, wherein the base material comprises a thermoplastic material.

5. The thermal interface material of claim 1, wherein the thermal conductivity of the sheet along the primary direction is at least 30 W/mK.

6. The thermal interface material of claim 1, wherein the sheet is characterized by a Shore hardness in the range of 40 to 90.

7. The thermal interface material of claim 1, wherein the filler material comprises ceramic flakes.

8. The thermal interface material of claim 1, wherein the filler material comprises flakes of boron nitrite.

9. The thermal interface material of claim 1, wherein the filler material comprises graphite flakes.

10. The thermal interface material of claim 1, wherein the filler material comprises graphene flakes.

11. The thermal interface material of claim 1, wherein the filler material comprises at least one selected from the list consisting of: carbon nanotubes, bundles of carbon nanotubes, and agglomerates of aligned carbon nanotubes.

12. The thermal interface material of claim 1, wherein the sheet comprises a region proximal the first major surface or second major surface of the sheet, said region containing a subset of the thermally conductive elements of the filler are that less anisotropically oriented than the thermally conductive elements located more distal to said surface.

13. The thermal interface material of claim 1, wherein the sheet comprises a first region proximal the first major surface of the sheet and a second region proximal to the second major surface of the sheet, wherein each of the first and second regions contain a respective subset of the thermally conductive elements of the filler that are less anisotropically oriented than the thermally conductive elements located more distal to said surfaces.

14. The thermal interface material of claim 1, wherein at least one of the first major surface and the second major surface of the sheet comprise a solvent-treated surface region.

* * * * *